United States Patent [19]
Novbakhtian

[11] Patent Number: 6,117,281
[45] Date of Patent: Sep. 12, 2000

[54] MAGNETRON SPUTTERING TARGET FOR REDUCED CONTAMINATION

[75] Inventor: Majeed Novbakhtian, Fremont, Calif.

[73] Assignee: Seagate Technology, Inc., Scotts Valley, Calif.

[21] Appl. No.: 09/004,325

[22] Filed: Jan. 8, 1998

[51] Int. Cl.[7] .................................................. G23C 14/34
[52] U.S. Cl. ........................ 204/192.16; 204/192.12; 204/192.15; 204/192.2; 204/298.12; 204/298.13; 204/298.19
[58] Field of Search ........................ 204/192.12, 192.15, 204/192.16, 192.2, 298.12, 298.13, 298.19

[56] References Cited

U.S. PATENT DOCUMENTS

| | | | |
|---|---|---|---|
| 4,834,860 | 5/1989 | Demaray et al. | 204/298.12 |
| 5,244,554 | 9/1993 | Yamagata et al. | 204/192.2 |
| 5,298,720 | 3/1994 | Cuomo et al. | 156/345 |
| 5,632,869 | 5/1997 | Hurwitt et al. | 204/192.12 |

FOREIGN PATENT DOCUMENTS

| | | | |
|---|---|---|---|
| 61-117274 | 6/1986 | Japan | 204/298.12 |
| 62-7856 | 1/1987 | Japan | 204/298.12 |
| 63-127432 | 5/1988 | Japan . | |

OTHER PUBLICATIONS

Selwyn et al., "Trapping and Behavior of Particulates in an RF Magnetron Plasma Etching Tool", J. Vac. Sci. Technol. A, 11, 1132–1135 (1993).

Selwyn et al., "Plasma Particulate Contamination Control: II. Self–Cleaning Tool Design", J. Vac. Sci. Technol. A, 10, 1053–1059 (1992).

*Primary Examiner*—Rodney McDonald
*Attorney, Agent, or Firm*—McDermott, Will & Emery

[57] ABSTRACT

A magnetron sputtering target is formed with a plurality of radially extending circumferential grooves to reduce particle contamination during sputtering. The grooves attract redeposited sputter material which is quickly resputtered during the early stages of fine particle nucleation.

22 Claims, 3 Drawing Sheets

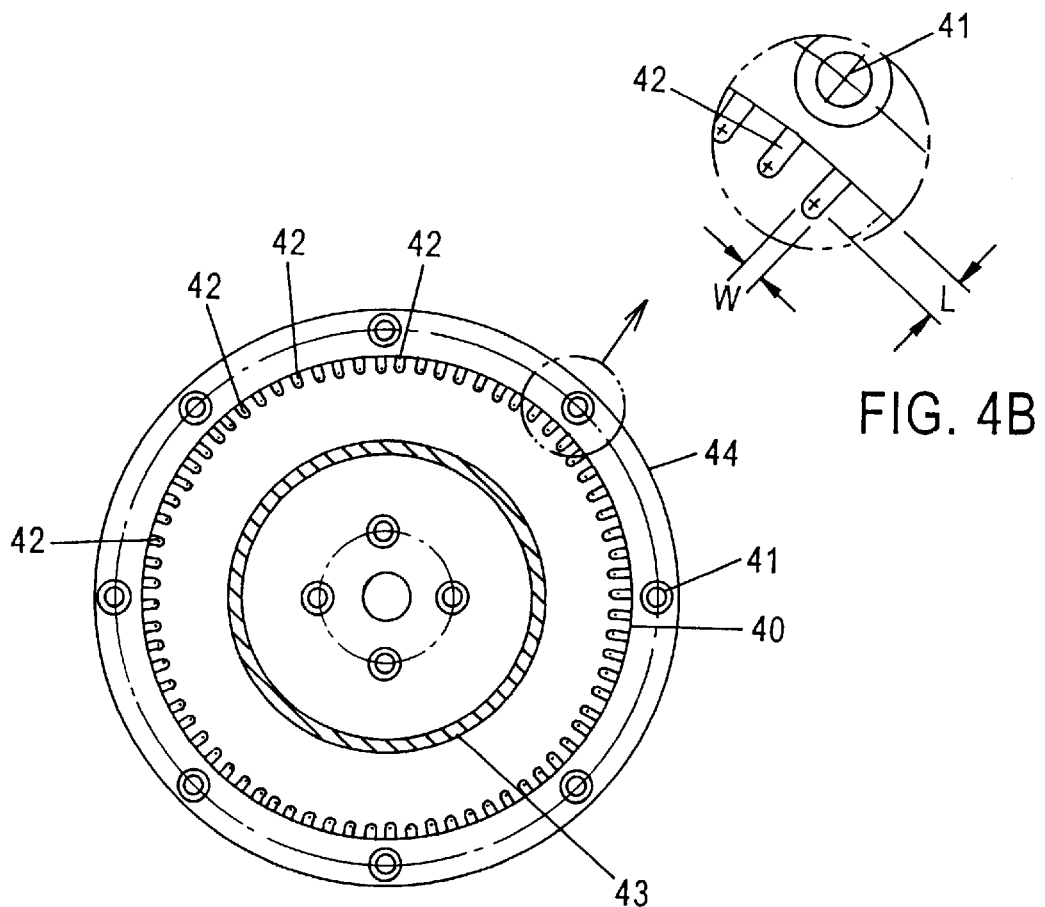
FIG. 4B
FIG. 4A
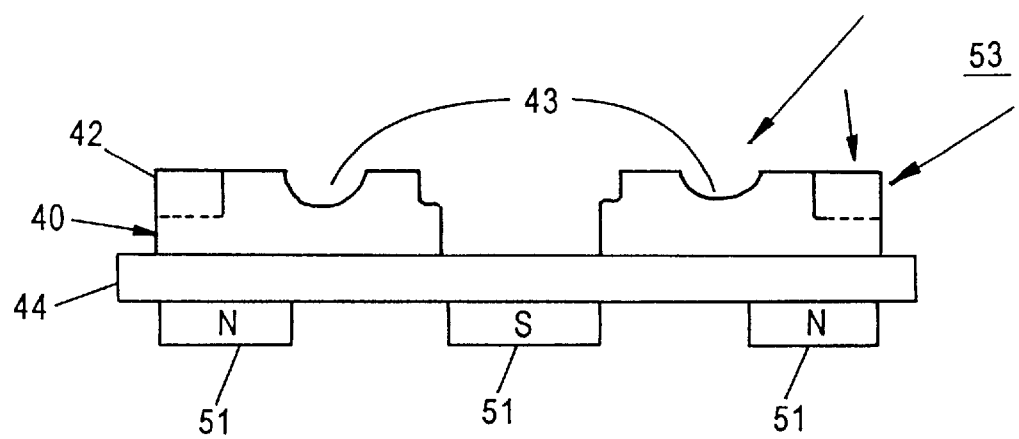
FIG. 5

MAGNETRON SPUTTERING TARGET FOR REDUCED CONTAMINATION

FIELD OF THE INVENTION

The present invention relates to a magnetron sputtering target, sputtering method and sputtering system comprising the magnetron sputtering target. The present invention has particular applicability in manufacturing magnetic recording media.

BACKGROUND OF THE INVENTION

Thin film deposition by a magnetron-driven sputtering process is widely used in the production of magnetic storage disks, semiconductor devices and emissive display technology. Magnetron sputtering is also conventionally employed for deposition of metallurgical coatings, window coatings and for various types of coatings employed in the food, medical and beverage industries. Magnetron sputtering generally operates by the generation of a low pressure plasma, typically in the range of 5 to 20 mTorr, of an inert gas such as argon. By embedding strong magnets into the electrode (either RF or DC-driven) of the plasma chamber, electron loss to the walls is reduced by the qv×B interaction of the electrons with the magnetic field present in the plasma, thereby enabling formation of a higher density plasma, even at low pressures. The use of low pressures desirably limits collision events between ions and neutrals due to greater directionality in the sputtering material and enables the generation of high energy ions for efficient sputtering of the target material.

Particle generation is a serious problem in magnetron plasmas, particularly in magnetron plasmas employed in the production of magnetic storage media, semiconductor devices and display technology, primarily because of the sensitivity of the final product to particle contamination, and the sensitivity of each film used in manufacturing the final product. Magnetron sputtering is generally considered a relatively "clean" process, because the use of low pressure minimizes homogeneous, or all-gas phase, nucleation of fine particles. However, as in most deposition processes, films are undesirably deposited onto the walls of the chamber as well as onto the product material. Conventional remedial approaches typically comprise removing the product, e.g., a magnetic recording medium or storage disk, after each film deposition step. However, film build-up on the internal surfaces of the tool is continuous. Eventually, a significant amount of film is deposited onto the walls, electrodes and shields of the magnetron chamber, which film undergoes flaking, thereby generating contaminant particles. Accordingly, even highly pure, low-pressure magnetron sputtering processes are plagued with significant quantities of contaminant particles.

To achieve desirable film deposition rates and thin film properties, an appropriate reactive gas chemistry is formulated in addition to argon or other inert gases during magnetron sputtering. For example, TiN films are produced by sputtering titanium in a nitrogen/argon plasma. For magnetic storage disk production, the use of carbonaceous chemistry, such as ethylene with argon, produces carbon films of desirable properties for protection of the magnetic layer. However, such reactive plasmas also suffer from particle contamination problems, because of the higher film deposition rate typical for reactive chemistries and the propensity of such chemistries to generate extremely fine particles that serve as nucleation sites. Furthermore, since the magnetic field lines in the center of the magnetron target are unfavorable for ion bombardment and a lower plasma density is present in this region, the center of a magnetron target generally has a low or negligible sputter rate. Consequently, film deposition occurs on the center of the magnetron target, particularly with reactive sputtering chemistries.

It is believed that the center region of a magnetron target undergoes film deposition preferentially on roughened surface structures, particularly sharp or thin protrusions from the target surface. It is recognized that electrode topography can induce localized plasma inhomogeneities, called "plasma traps", which are regions of slightly elevated plasma potential caused by localized differences in the ionization rate near the sheath. Changes in the electrode topography, especially sharp or rough surfaces, induce changes in the plasma ionization rate by changing the flux of secondary electrons into the plasma. Particles in a plasma typically acquire a negative charge due to the much greater mobility of electrons relative to ions. Accordingly, the presence of surface roughness or uneven film deposits on the center of the magnetron target further exacerbate film deposition in this region, because particles present in the plasma migrate to these traps and eventually attach to the surface nonuniformities, resulting in preferential surface growth. This, in turn, enhances the plasma traps near the surface roughness and causes additional particles to agglomerate onto these non-uniformities. In other words, the particle contamination process accelerates with time.

The contamination of magnetic recording media by particles or dust generated during film deposition is a leading cause of yield loss and disk failure. Particles interfere with the thin film deposition process employed in manufacturing magnetic recording media by creating bulges, bumps and discontinuities in thin films. Particles embedded into the disk media also cause catastrophic failure by collision with the disk head, as well as generating thin film defects. Often, conditions favorable for thin film properties also lead to particle generation during disk manufacture, thereby reducing product yield and increasing production costs.

A conventional approach to the particle contamination problem comprises repeated target cleaning. In this approach, the plasma operation is shut down and the chamber is vented to atmospheric pressure and then opened for cleaning. Cleaning consists of scrubbing the target face and interior wall surfaces of the chamber. The surfaces of the chamber are then vacuumed cleaned, the chamber is sealed, pumped-down and the plasma operation resumed. Although this approach controls contamination, it disrupts operation and throughput of the chamber to a considerable extent. In addition, particle contamination problems increase with plasma operation time between the cleaning cycles. For ultra-clean operations, a very high frequency of cleaning procedures is required, which greatly reduces throughput of a particular chamber, thereby increasing manufacturing costs and reducing production throughput. Moreover, labor costs for cleaning the tool are considerable, and the cleaning operation introduces potential health and safety problems caused by the release of dust into the room housing the magnetron tool (chamber).

Another conventional approach to contamination control in magnetron plasma processes involves the use of "ramp-down" in applied radio-frequency power. This technique is based on the reduction in particle trap intensity with decreasing applied RF power, thereby weakening the trapping field. By increasing gas pressure and flow rate at the completion of the plasma process, the trapped particles are carried out of the traps by the gas drag force. This approach is taught by Selwyn et al., ("Trapping and Behavior of Particulates in an RF Magnetron Plasma Etching Tool", J. Vac. Sci. Technol. A, 11, 1132–1135 (1993)). However, this approach presupposes the use of single wafer processing and, hence, is not appropriate for continuous batch processing, as in the production of magnetic recording media. In addition, the use of a high pressure purge presents vacuum incompatibility problems in very large production tools.

Another prior approach to the sputtering particle contamination problem comprises forming grooves in electrodes to attract suspended particles in a plasma, as disclosed in U.S. Pat. No. 5,298,720, for a conventional planar diode plasma process. The presence of the grooves, combined with an extension of the grooves to the pump port, causes particles to be attracted to the grooves and purged out of the plasma by the gas drag force (the "Stokes force") of the feed gas directed along the direction of the grooves. This approach is also described by Selwyn and Patterson in "Plasma Particulate Contamination Control: II. Self-Cleaning Tool Design", J. Vac. Sci. Technol. A, 10, 1053–1059 (1992). However, this approach is not practical for magnetron sputtering, because the grooves would necessarily cut across the racetrack region and, hence, reduce the lifetime of the target as well as alter deposition uniformity. Additionally, the low pressure operation of a magnetron results in molecular flow as opposed to viscous flow gas dynamics. As a result, the directed movement of particles resulting from the Stokes force contribution is negligible, so that particle movement is nil. These factors combine to make this alternative technology unsuitable for magnetrons.

Accordingly, there exists a need for a magnetron sputtering target, a magnetron sputtering system and a magnetron sputtering process with reduced particle contamination. There exists a particular need for a magnetic sputtering target for use in manufacturing a magnetic recording medium with reduced particle contamination.

DISCLOSURE OF THE INVENTION

An object of the present invention is a magnetron sputtering target which, in use, experiences significantly reduced or virtually no particle contamination.

Another object of the present invention is a method of manufacturing a magnetic recording medium comprising sputter depositing a plurality of layers using magnetron sputtering targets designed for reduced particle contamination.

Additional objects, advantages and other features of the invention will be set forth in each description which follows, and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a magnetron sputtering target comprising a plurality of grooves formed along a peripheral portion of the target.

Another aspect of the present invention is a substantially circular magnetron sputtering target comprising a plurality of grooves extending a substantially radial direction substantially along the entire periphery of the target, wherein the grooves are dimensioned such that, during magnetron sputtering, contamination of the target by redeposited sputtered particles is reduced.

Additional objects and advantages of the present invention will become readily apparent to those skilled in this art from the following detailed description, wherein embodiments of the invention are described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF DRAWINGS

FIG. 4A is a top schematic view of a magnetron sputtering target in accordance with an embodiment of the present invention.

FIG. 4B illustrates an enlarged peripheral portion of the magnetron sputtering target of FIG. 4A.

FIG. 5 is a cross-sectional view of a sputtering target in accordance with an embodiment of the present invention.

DESCRIPTION OF THE INVENTION

Figure 1:
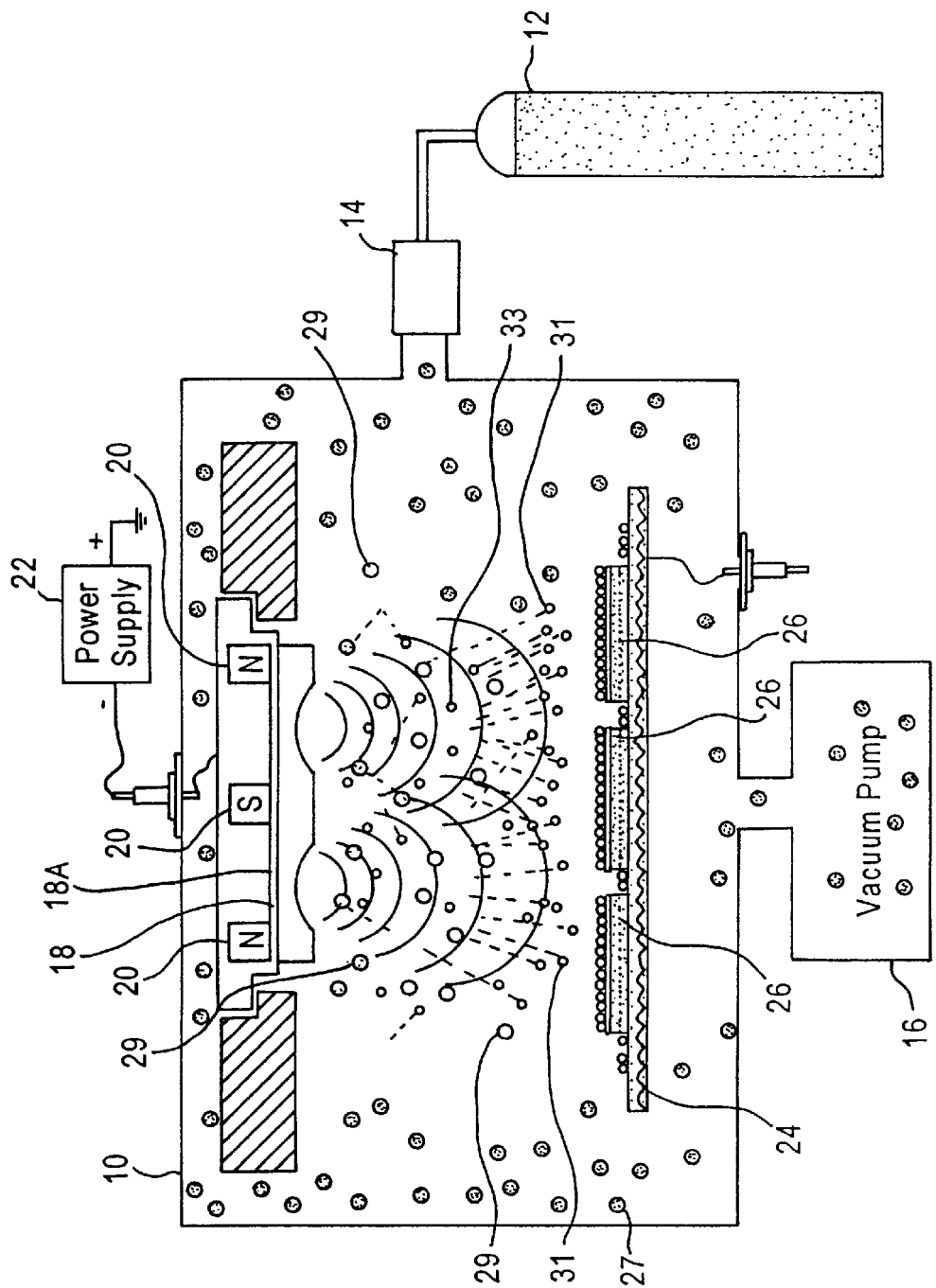
FIG. 1 schematically illustrates a DC magnetron sputtering system in accordance with an embodiment of the present invention.

The present invention addresses and solves the particle contamination problem invariably encountered in conventional magnetron sputtering systems and methodology, particularly in manufacturing magnetic recording media. In accordance with the present invention, a sputtering target is strategically designed for reduced particle contamination by creating trapping nucleation centers on the target surface. Such trapping centers can be in the form of retention recesses or grooves, as by machining, in strategically selected regions of the target, as on the periphery of the target. Embodiments of the present invention comprise targets of various geometrical configurations, such as polygonal, e.g., rectangular or square. It has been found particularly suitable to shape the targets in the form of disks, e.g., substantially circular targets. In accordance with embodiments of the present invention, the targets are provided with strategically positioned spaced apart grooves, e.g., extending in a substantially radial direction along the target periphery. Embodiments include positioning such radially extending grooves along the entire periphery of the target. The present invention, therefore, enables magnetron sputtering without requiring the cumbersome and costly cleaning procedures conventionally employed.

The grooves in accordance with embodiments of the present invention are strategically positioned on the target and strategically designed in terms of dimensions to attract and collect sub-micron particles generated in the plasma which would otherwise form uncontrolled surface filaments on the target, which filaments eventually fracture, generating high velocity particles that embed themselves into disks during sputtering. The present invention, therefore, provides machined grooves of strategic size and location to reduce particle contamination and, thereby, significantly improve the quality of the thin film product, such as a magnetic recording medium.

The products produced in accordance with the present invention exhibit significantly less film defects and require a relatively short frequency of preventive maintenance during manufacturing, particularly sputter deposition.

Accordingly, manufacturing costs are reduced, production throughput is increased, and product quality and reliability are improved. Moreover, the present invention is relatively inexpensive to implement and can be employed in various types of magnetron sputtering systems and processes, including carbon deposition and magnetic alloy deposition in manufacturing magnetic recording media. The conventional preventive cleaning procedure can also be employed in combination with the present invention; however, the frequency of cleaning is significantly reduced, thereby significantly increasing production throughput and reducing manufacturing costs vis-a-vis conventional practices.

In accordance with the present invention, a magnetron sputtering target is formed of a desired target material, such as a chromium-containing material for depositing an underlayer of a magnetic recording medium; a magnetic layer, such as a cobalt alloy layer, for depositing a magnetic layer on an underlayer; or a carbonaceous material for depositing a carbon protective overcoat on a magnetic layer. Such materials are conventionally employed in manufacturing magnetic recording media and, hence, are not described herein in detail. The inventive magnetron sputtering target is not confined to manufacturing magnetic recording media, but can be employed in sputter depositing various types of materials in various industrial applications, e.g., semiconductor devices and emissive display devices.

In accordance with an embodiment of the present invention, a sputtering target is configured in a substantially circular shape and provided with a plurality of substantially radially extending grooves along the periphery of the target. The grooves are strategically positioned and dimensioned to substantially reduce particle contamination during sputtering.

After extensive experimentation and investigation, it was found that redeposited molecules, such as molecules of an insulating material, begin to grow on the surface of the target and reduce the width of the sputtering area, thereby reducing target life. Charge buildup on such a layer accelerates the growth and introduction of destructive particulates which are ejected into the plasma and then deposited on the surface of the substrate creating a bump defect. It was found that the strategically positioned peripheral grooves act as a well for electrons, i.e., electrons are confined within the well. Redeposited molecules in the grooves are sputtered back onto the substrate and surrounding walls on an atomic scale. However, the nucleation of undesirable particles of the surface of the target is advantageously eliminated by resputtering the redeposited materials constantly at the very early stages of nucleation.

After further investigation and experimentation, it was found that strategically positioned and dimensioned grooves effect constant resputtering at very early stages of nucleation. It was further found that properly dimensioned grooves, e.g., grooves having a controlled height, effectively prevent the electrons from leaving the grooves, i.e., the interaction of electrons with a magnetic field is such that the electrons cannot overcome the height of the grooves. Consequently, a high number of electrons remain in the grooves and are constantly pulled by the cosine component of the magnetic force. Thus, the height of the grooves prevents the flow of electrons to the racetrack formed in the target.

The precise dimensions of the grooves and spacing between grooves can be optimized in a particular situation, e.g., for a given target shape and size. For example, effective particle contamination reduction was achieved employing a substantially circular target having a diameter of about 5", with substantially radially extending grooves spaced apart by a distance of about 0.1" to about 0.2" and each groove having a length from the periphery up to about 0.15", a circumferential width of about 0.05" to about 0.1" and extending substantially vertically into the target to a depth of about 0.10" to about 0.19".

In an embodiment of the present invention, a substantially circular sputtering target having a diameter of about 5" was prepared with about 72 radially extending circumferential grooves spaced apart by a distance of about 0.14", each groove having a length of about 0.15", a width of about 0.08" and a depth of about 0.12", whereby particulate contamination was virtually eliminated. In fact, upon inspection after sputtering, the grooves were found to be noticeably clean without an indication of any significant redeposition.

In various embodiments of the present invention, the target is provided on a mounting base, comprising a suitable material, e.g., a metal such as copper or an alloy thereof. The mounting base typically has a shape similar to the shape of the target. Thus, in employing a disk or circular target, the mounting base is formed as a disk or circular in shape with a diameter greater than the target diameter. The target is adhered to the mounting base in a conventional manner, as by bonding with tin/silver or indium. The mounting base is provided with openings for mounting to a support within a sputtering chamber in a conventional manner. Magnets are provided on the mounting base opposite the target such that, upon magnetron sputtering, a magnetic field is created causing a substantially circular erosion pattern on the target surface during sputtering, referred to as a "racetrack".

FIG. 1 schematically illustrates a DC magnetron sputtering system constructed in accordance with the present invention. Sputter deposition is the most commonly used method in the rigid disk industry for deposition of underlayers, magnetic films and protective overcoats. Sputter deposition is a coating process that involves the transport of almost any material from a source (called the target) to a substrate of almost any material.

The magnetron sputtering system of the present invention depicted in FIG. 1 comprises chamber 10 in which sputtering is conducted. Chamber 10 is supplied with gas from gas supply 12 through precision gas flow controller 14. Embodiments include the use of an inert gas, such as argon.

A vacuum pump 16 communicates with chamber 10 to enable sputtering in a reduced pressure in argon gas. The reduced pressure, or vacuum, is desirable to increase the distance sputtering atoms travel without undergoing a collision with each other or with other particles. Argon gas is ionized, resulting in the generation of a plasma in chamber 10.

Chamber 10 contains target 18 containing the material to be sputtered onto a substrate surface, such as a non-magnetic substrate 26 for manufacturing a magnetic recording medium. Although a magnetic disk is discussed for purposes of illustration, the present invention is applicable to sputtering on various substrates or substrate surfaces for various industrial applications.

Target 18 is a magnetron target with magnets 20 provided on the back of mounting base 18A. A power supply 22 is coupled to magnetron 20, and another electrode is coupled to a carrier 24 on which substrates 26 are mounted. Power supply 22 produces a high voltage that accelerates the gas ions. Ejection of the source material from the target 18 is then accomplished by bombardment of the target surface with the gas ions that have been accelerated by the high voltage. As a result of momentum transfer between incident ions and target 18, particles of atomic dimension are ejected from target 18. The ejected particles traverse the vacuum chamber 10 and are subsequently deposited on substrate 26 as a thin film.

In FIG. 1, the solid large circles identified by reference numeral 27 represent argon atoms and the empty large circles identified by reference numeral 29 represent argon ions. Electrons are denoted by reference numeral 31 and the sputtered target material denoted by reference numeral 33.

Any of various materials can be sputtered and the deposited films typically have substantially the same composition as the source or target material. Such materials include titanium nitride, chromium, chromium alloys, cobalt, cobalt alloys, and carbonaceous materials including various forms of carbon. There are several variations of sputtering processes and the exemplary embodiment of a DC glow discharge magnetron configuration is the most common currently used in magnetic media fabrication.

Figure 2:
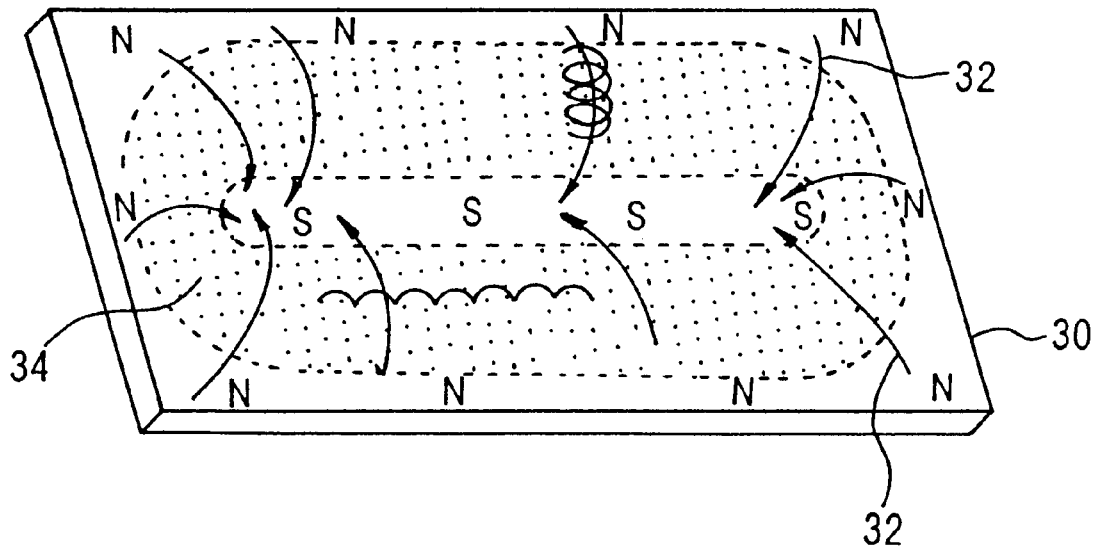
FIG. 2 is a top perspective view of a conventional magnetron sputtering target.
Figure 3:
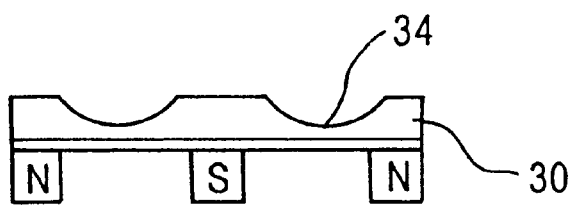
FIG. 3 is a cross-sectional view of the conventional magnetron sputtering target of FIG. 2.

FIG. 2 is a perspective view of a conventional target 30. A magnetic field is used to trap electrons close to the sputtering target 30. The magnetic field, denoted by reference numeral 32, causes a "racetrack" region 34 to form during the sputtering process. The racetrack region 34 is the area of the target that undergoes erosion during the sputtering process due to the ejection of particles therefrom. Electron confinement enhances the ionization rate of the argon atoms close to the cathode and produces a very high rate of sputtering. FIG. 3 is a cross-section of the conventional target 30 depicted in FIG. 2.

Film deposition or redeposition disadvantageously occurs at the center region of magnetron target 30. Additionally, film redeposition occurs preferentially on roughened surfaces, particularly on sharp or thin protrusions from the target surface. Electrode topography can induce localized plasma inhomogeneities, called "plasma traps". Plasma traps are regions of slightly elevated plasma potential caused by localized differences in the ionization rate near the sheath. Changes in the electrode topography, especially sharp or rough surfaces, induce changes in the plasma ionization rate by changing the flux of secondary electrons into the plasma. Particles in any plasma will acquire a negative charge due to the much greater mobility of electrons relative to ions. Accordingly, the presence of surface roughness or uneven film deposits on the center of the magnetron target further exacerbate film deposition in this region, because particles present in the plasma migrate to these traps and eventually attach to the surface nonuniformities, resulting in preferential surface growth. This, in turn, enhances the plasma traps near the surface roughness and causes additional particles to agglomerate onto these non-uniformities. In other words, the process accelerates with time.

The system of the present invention of FIG. 1 reduces such particulate contamination problems by employing a magnetron sputtering target 18 comprising strategically positioned and dimensioned grooves into which contaminant particles are attracted, retained and resputtered.

In an embodiment of the present invention, a magnetron sputtering target 40, as shown in FIG. 4A, is formed in the shape of a disk, e.g., a substantially circular configuration. The upper surface is provided with a plurality of substantially radially extending grooves 42 along the periphery. Target 40 is mounted to base 44 which is provided with holes 41 for mounting to a support in a sputtering tool or chamber, as with screws or bolts. Reference numeral 43 denotes a substantially circular racetrack area or portion of the target surface eroded during sputtering due to the ejection of particles therefrom.

FIG. 4B is an enlargement of a peripheral portion of target 40. Typically, grooves 42 are spaced apart by a distance of about 0.1", to about 0.2", each groove having a length L extending from the periphery in a radial direction of up to about 0.15", a width W of about 0.05" to about 0.1" and a substantially vertical depth into the target of about 0.10" to about 0.19".

A cross-sectional view of target 40 shown in FIG. 4A is depicted in FIG. 5. Magnets 51 are provided on mounting base 44 resulting in the formation of racetrack 43.

In accordance with the present invention, the radial spacing between the grooves is designed such that trapped particles are resputtered. Consequently, the grooves exhibit a surprisingly clean appearance. The mechanism underlying the reduction in contaminate particles is not known. However, it is believed that redeposited molecules on collision with the surface of the target are physisorbed as a precursor state before gaining sufficient energy to transform to a chemisorbed state. Such redeposited molecules are believed to acquire sufficient thermal energy from the lattice to be transported between adjacent adatom sites to begin nucleation and then grow of a contaminant layer, such as an insulating layer. The substantial number of adatoms with sufficient lifetime and surface diffusion coefficient on the target surface reach the grooves, characterized by sharp corners with high surface energies. As a result, the adatoms are incorporated as groove particles where they are sputtered back to the surrounding in molecular size. This occurs advantageously constantly at very early stages of nucleation.

The present invention provides an elegant, effective and inexpensive way to control particulate contamination in any of various types of magnetron processes, including carbon deposition and magnetic alloy deposition during the manufacture of magnetic storage disks. The present invention not only reduces the rate of particle contamination on disks, but significantly reduces the frequency of preventative maintenance, thereby increasing production throughput, reducing manufacturing costs and increasing product reliability. The present invention is also applicable to other magnetron-based deposition processes, such as in the production of semiconductor devices and flat panel display technology.

In manufacturing semiconductor devices and magnetic recording media in accordance with the present invention, conventional equipment, components and methodology can be employed. In manufacturing magnetic recording media in accordance with the present invention, any substrate typically employed in the manufacture of magnetic recording media can be employed, such as glass, ceramic, or glass-ceramic materials. Other conventional substrates include aluminum alloy substrates with a coating thereon, such as nickel-phosphorous. Laser technology can be employed to provide an appropriate texture to create a suitable surface topography in a conventional manner.

In manufacturing a magnetic recording medium in accordance with the present invention, an underlayer, a magnetic layer, a carbon containing protective overcoat and a lubricant topcoat are typically sequentially applied on both surface of a non-magnetic substrate. The underlayer, magnetic layer and carbon-containing protective overcoat are sequentially sputter deposited. Each layer can be sputter deposited employing a target in accordance with various embodiments of the present invention. The present invention is not limited to sputter depositing a single underlayer, or a single magnetic layer, but encompasses the deposition of a plurality of underlayers and magnetic layers, as well as a plurality of protective overcoats.

The present invention can be employed to produce any of various types of magnetic recording media, including thin film disks, with an attendant reduction in rejection rate, increased production throughput reduced manufacturing costs and increased reliability. The present invention is particularly applicable in the production of high areal recording density and magnetic recording media.

Only the preferred embodiment of the invention and but a few examples of its versatility are shown and described in the present invention. It is to be understood that the invention is capable of use in various other combinations and environments and is capable of changes or modifications within the scope of the inventive concept as expressed herein.

What is claimed is:

1. A magnetron sputtering target comprising a sputtering surface including a plurality of spaced apart grooves formed in a narrow band up to about 0.15" wide extending along a peripheral portion thereof and dimensioned such that, during magnetron sputtering, contamination of the target sputtering surface by redeposited sputtered particles is reduced, wherein the target is substantially circular and the grooves forming said narrow band extend in a substantially radial direction substantially along the entire periphery of the target sputtering surface substantially vertically into the target material to a depth of about 0.10" to about 0.19" and have a width in the circumferential direction of about 0.05" to about 0.1".

2. The magnetron sputtering target according to claim 1, wherein the grooves are dimensioned such that target material redeposited within the grooves is resputtered.

3. The magnetron sputtering target according to claim 1, wherein the grooves extend inwardly from the periphery of the target sputtering surface in a radial direction for a length of about 0.15".

4. The magnetron sputtering target according to claim 3, wherein the grooves have a length in the radial direction of about 0.15", a width of about 0.08" and a depth of about 0.12".

5. The magnetron sputtering target according to claim 1, wherein at least said sputtering surface of the target comprises an insulating material.

6. The magnetron sputtering target according to claim 5, wherein the insulating material comprises porous carbon.

7. The magnetron sputtering target according to claim 1, mounted on a support base.

8. The magnetron sputtering target according to claim 1, mounted on a support, wherein the support base is substantially circular and has a radius larger than the radius of the target.

9. The magnetron sputtering target according to claim 8, comprising magnets provided on the rear surface of the support base arranged to create a magnetic field causing a substantially circular erosion pattern on the target sputtering surface during sputtering.

10. The magnetron sputtering target according to claim 1, wherein the grooves are spaced apart by a distance of about 0.1" to about 0.2".

11. A magnetron sputtering apparatus including a magnetron sputtering target comprising a sputtering surface including a plurality of spaced apart grooves formed in a narrow band up to about 0.15" wide extending along a peripheral portion thereof, wherein the grooves are dimensioned such that, during magnetron sputtering, contamination of the target sputtering surface by redeposited sputtered particles is reduced, the target is substantially circular and the grooves forming said narrow band extend in a substantially radial direction substantially along the entire periphery of the target sputtering surface vertically into the target material to a depth of about 0.10" to about 0.19" and have a width in the circumferential direction of about 0.05" to about 0.1".

12. The magnetron sputtering apparatus according to claim 11, wherein the grooves extend inwardly from the periphery of the target sputtering surface in a substantially radial direction for a length of about 0.15".

13. A method of sputtering, comprising sputtering material from a magnetron sputtering target having a sputtering surface comprising a plurality of spaced apart grooves formed in a narrow band up to about 0.15" wide extending along a peripheral portion thereof, wherein the grooves are dimensioned such that, during magnetron sputtering, contamination of the target sputtering surface by redeposited sputtered particles is reduced, the target is substantially circular and the grooves forming said narrow band extend in a substantially radial direction substantially along the entire periphery of the target sputtering surface vertically into the target material to a depth of about 0.10" to about 0.19" and have a width in the circumferential direction of about 0.05" to about 0.1".

14. The method according to claim 13, wherein the grooves extend inwardly from the periphery of the target sputtering surface in a substantially radial direction for a length of about 0.15".

15. The method according to claim 14, comprising sputtering a non-magnetic layer onto a non-magnetic substrate.

16. The method according to claim 15, wherein the non-magnetic layer is an underlayer of a magnetic recording medium.

17. The method according to claim 16, further comprising sputtering a magnetic layer on the underlayer from a substantially circular magnetron sputtering target comprising a magnetic sputtering material and having spaced apart grooves forming a narrow band extending in a substantially radial direction along the entire periphery of the sputtering surface of the target.

18. The method according to claim 17, wherein the underlayer comprises chromium and the magnetic layer comprises cobalt.

19. The method according to claim 17, wherein the grooves extend along the sputtering surface of the magnetic material-containing target at the periphery thereof in a substantially radial direction for a length of about 0.15".

20. The method according to claim 17, further comprising sputtering a carbon-containing protective layer on the magnetic layer from a substantially circular magnetron sputtering target comprising a carbonaceous material and having spaced apart grooves forming a narrow band extending in a substantially radial direction along the entire periphery of the sputtering surface of the target.

21. The method according to claim 20, wherein the grooves extend along the sputtering surface of the carbonaceous material-containing target at the periphery thereof in a substantially radial direction for a length of about 0.15".

22. A magnetron sputter system, comprising:

a magnetron sputtering target having a sputtering surface bounded by a periphery; and means comprising a plurality of inwardly extending grooves up to about 0.15" long forming a narrow band extending along said sputtering surface at said periphery for attracting redeposited sputtered material and resputtering the redeposited sputtered material thereby reducing contamination.

* * * * *